United States Patent
Endo et al.

(10) Patent No.: US 12,248,037 B2
(45) Date of Patent: Mar. 11, 2025

(54) MAGNETIC SENSOR

(71) Applicant: SHOWA DENKO K.K., Tokyo (JP)

(72) Inventors: Daizo Endo, Ichihara (JP); Tatsunori Shino, Ichihara (JP); Akira Sakawaki, Ichihara (JP); Sho Tonegawa, Ichihara (JP); Yasumasa Watanabe, Ichihara (JP)

(73) Assignee: Resonac Corporation, Tokyo (JP)

( * ) Notice: Subject to any disclaimer, the term of this patent is extended or adjusted under 35 U.S.C. 154(b) by 239 days.

(21) Appl. No.: 17/596,213

(22) PCT Filed: Nov. 17, 2020

(86) PCT No.: PCT/JP2020/042698
§ 371 (c)(1),
(2) Date: Dec. 6, 2021

(87) PCT Pub. No.: WO2021/131401
PCT Pub. Date: Jul. 1, 2021

(65) Prior Publication Data
US 2022/0381853 A1    Dec. 1, 2022

(30) Foreign Application Priority Data
Dec. 26, 2019    (JP) ................. 2019-237379

(51) Int. Cl.
G01R 33/06    (2006.01)
(52) U.S. Cl.
CPC ................. *G01R 33/063* (2013.01)
(58) Field of Classification Search
CPC ................................................ G01R 33/063
See application file for complete search history.

(56) References Cited

U.S. PATENT DOCUMENTS

| | | | |
|---|---|---|---|
| 7,615,996 B1 | 11/2009 | Machita et al. | |
| 2010/0045285 A1* | 2/2010 | Ohmori | G01R 33/093 427/547 |

(Continued)

FOREIGN PATENT DOCUMENTS

| | | |
|---|---|---|
| JP | 10-270775 A | 10/1998 |
| JP | 2001-4728 A | 1/2001 |

(Continued)

OTHER PUBLICATIONS

International Search Report for PCT/JP2020/042698 dated Feb. 9, 2021 [PCT/ISA/210].

(Continued)

*Primary Examiner* — Stephanie E Bloss
*Assistant Examiner* — Michael A Harrison
(74) *Attorney, Agent, or Firm* — Sughrue Mion, PLLC

(57) ABSTRACT

A magnetic sensor includes: a non-magnetic substrate; and a sensitive element 31 having a longitudinal direction and a short direction, provided with uniaxial magnetic anisotropy in a direction crossing the longitudinal direction, and sensing a magnetic field by a magnetic impedance effect, wherein the sensitive element 31 includes plural soft magnetic material layers 105a to 105d and plural non-magnetic material layers 106a to 106c configured with a non-magnetic material and laminated between the plural soft magnetic material layers 105a to 105d, and the soft magnetic material layers 105a to 105d facing each other with each of the non-magnetic material layers 106a to 106c interposed therebetween are antiferromagnetically coupled.

6 Claims, 7 Drawing Sheets

(56) References Cited

U.S. PATENT DOCUMENTS

| | | | |
|---|---|---|---|
| 2011/0068786 A1* | 3/2011 | Ohta | G01R 33/0052 324/252 |
| 2020/0341077 A1 | 10/2020 | Endo | |
| 2021/0141035 A1 | 5/2021 | Endo | |

FOREIGN PATENT DOCUMENTS

| | | |
|---|---|---|
| JP | 2002-176210 A | 6/2002 |
| JP | 2008-249406 A | 10/2008 |
| JP | 2019-100847 A | 6/2019 |
| WO | 2018/230116 A1 | 12/2018 |

OTHER PUBLICATIONS

Masaaki Takezawa et al., "Antiferromagnetic Coupled High-Frequency Carrier-Type Magnetic Field Sensor Using Ni—Fe/Fe—Mn Multilayer", IEEE Transactions on Magnetics, vol. 38, No. 5, Sep. 2002, pp. 3150-3152 (3 pages).

\* cited by examiner

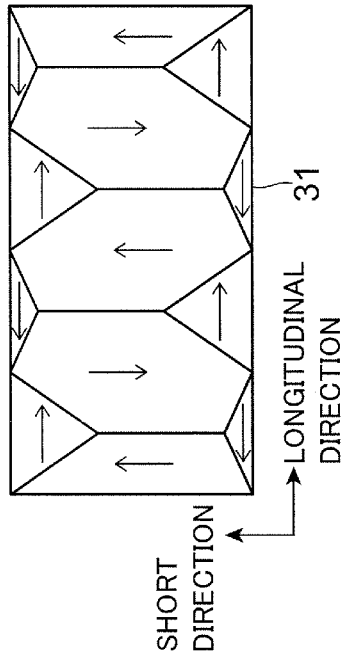
FIG.4A INITIAL MAGNETIC PERMEABILITY RANGE (CLOSURE MAGNETIC DOMAIN)
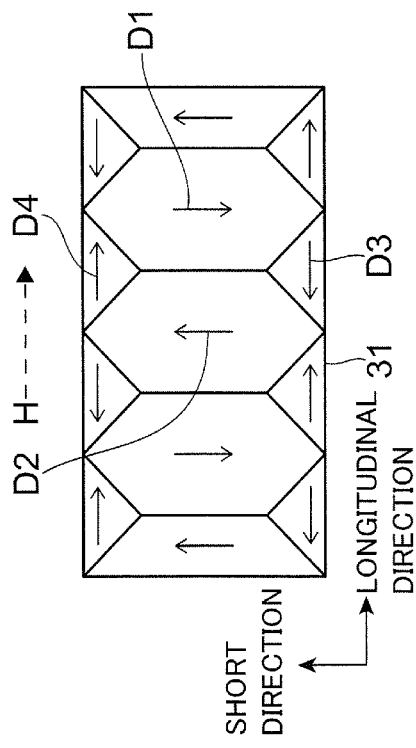
FIG.4B IRREVERSIBLE MAGNETIC DOMAIN WALL DISPLACEMENT RANGE (MAGNETIC DOMAIN WALL DISPLACEMENT)
FIG.4C ROTATIONAL MAGNETIZATION RANGE (MAGNETIZATION ROTATION)
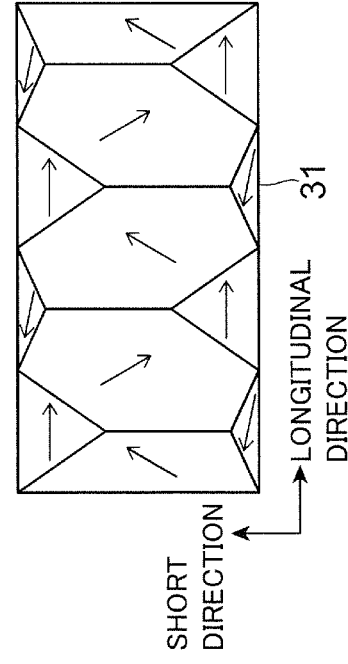
FIG.4D SATURATION (SINGLE MAGNETIC DOMAIN)

SHORT
DIRECTION

LONGITUDINAL DIRECTION

SHORT
DIRECTION
→ LONGITUDINAL DIRECTION

SHORT
DIRECTION
→ LONGITUDINAL DIRECTION

MAGNETIC SENSOR

CROSS REFERENCE TO RELATED APPLICATIONS

This application is a National Stage of International Application No. PCT/JP2020/042698filed Nov. 17, 2020, claiming priority based on Japanese Patent Application No. 2019-237379 filed Dec. 26, 2019.

TECHNICAL FIELD

The present invention relates to a magnetic sensor.

BACKGROUND ART

As a related art described in a gazette, there is a magnetic impedance effect element including: a thin film magnet configured with a hard magnetic material film formed on a nonmagnetic substrate; an insulating layer covering the top of the thin film magnet; and a magneto-sensitive part formed on the insulating layer and configured with one or plural rectangular soft magnetic material films provided with uniaxial anisotropy (refer to Patent Document 1).

CITATION LIST

Patent Literature

Patent Document 1: Japanese Patent Application Laid-Open Publication No. 2008-249406

SUMMARY OF INVENTION

Technical Problem

In magnetic sensors using a sensitive element with a soft magnetic material layer as the magnetic impedance effect element, depending on the lamination structure of the sensitive element, the S/N ratio, which is the ratio of the signal and the noise at the output from the magnetic sensor, was sometimes reduced.

An object of the present invention is to suppress reduction of the S/N ratio at an output from a magnetic sensor using the magnetic impedance effect.

Solution to Problem

A magnetic sensor, to which the present invention is applied, includes: a non-magnetic substrate; and a sensitive element having a longitudinal direction and a short direction, provided with uniaxial magnetic anisotropy in a direction crossing the longitudinal direction, and sensing a magnetic field by a magnetic impedance effect, wherein the sensitive element includes plural soft magnetic material layers and plural non-magnetic material layers configured with a non-magnetic material and laminated between the plural soft magnetic material layers, and the soft magnetic material layers facing each other with each of the non-magnetic material layers interposed therebetween are antiferromagnetically coupled.

Here, each of the non-magnetic material layers may be composed of Ru or an Ru alloy.

In addition, each of the non-magnetic material layers may have a thickness within a range of 0.6 nm or more and 1.4 nm or less.

Moreover, when the soft magnetic material layer is viewed from a lamination direction of the soft magnetic material layer, no closure magnetic domain may be formed in the sensitive element.

Advantageous Effects of Invention

According to the present invention, it is possible to suppress reduction of the S/N ratio at the output from the magnetic sensor using the magnetic impedance effect.

BRIEF DESCRIPTION OF DRAWINGS

FIGS. 4A to 4D are diagrams illustrating, in a conventional magnetic sensor, a relation between strength of a magnetic field H applied to a sensitive element and change in a magnetic domain in the sensitive element;

DESCRIPTION OF EMBODIMENT

Hereinafter, an exemplary embodiment according to the present invention will be described with reference to attached drawings.

Figure 1A:
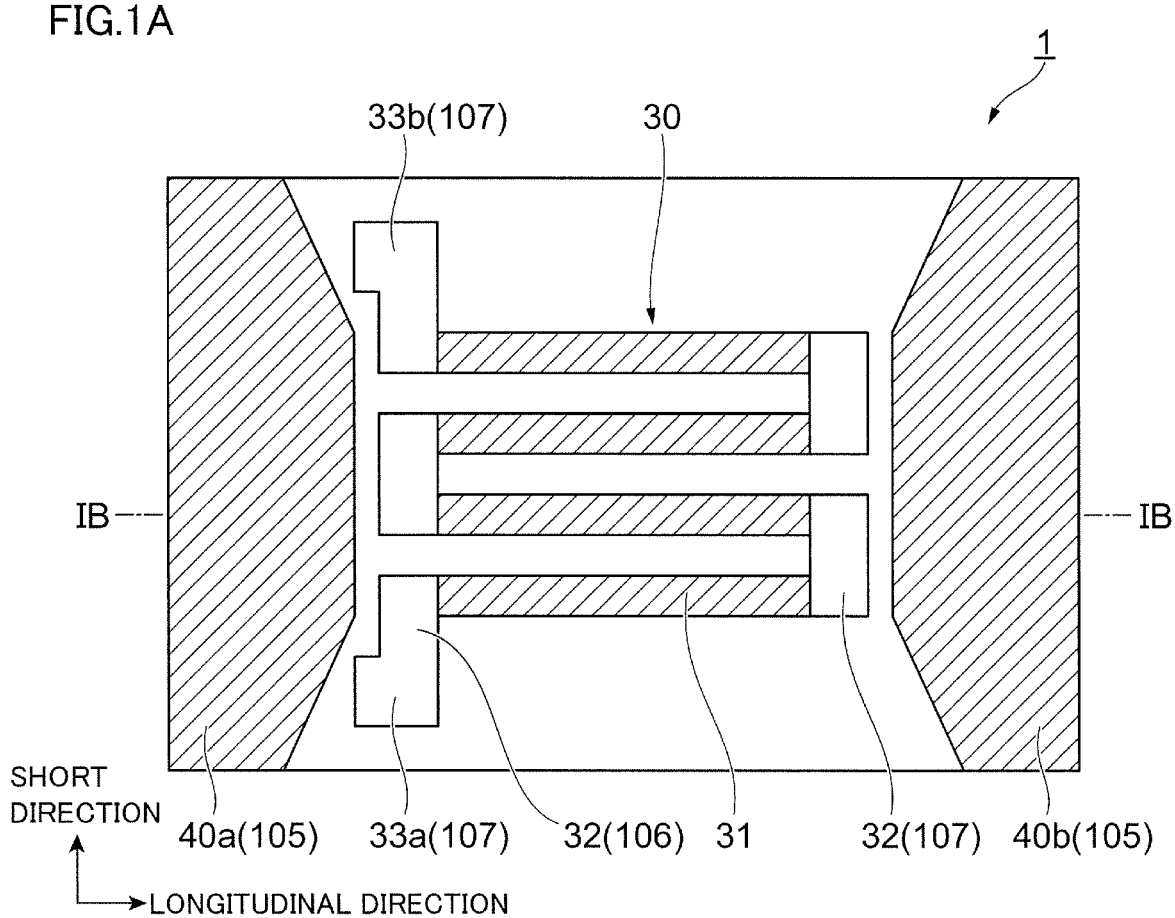
FIGS. 1A and 1B are diagrams illustrating an example of a magnetic sensor to which the exemplary embodiment is applied.
Figure 1B:
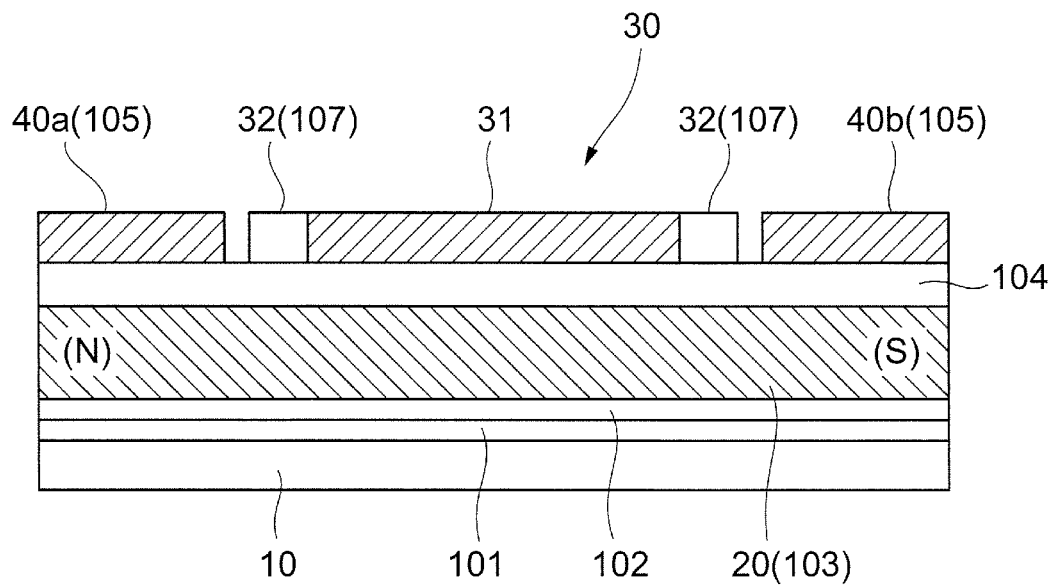

FIGS. 1A and 1B are diagrams illustrating an example of a magnetic sensor 1 to which the exemplary embodiment is applied. FIG. 1A is a plan view of the magnetic sensor 1, and FIG. 1B is a cross-sectional view along the IB-IB line in FIG. 1A.

As shown in FIG. 1B, the magnetic sensor 1 to which the exemplary embodiment is applied includes: a thin film magnet 20 configured with a hard magnetic material (a hard magnetic material layer 103) provided on a non-magnetic substrate 10; and a sensitive part 30 laminated to face the thin film magnet 20 and configured to include a soft magnetic material (a soft magnetic material layer 105) and a non-magnetic material (a non-magnetic material layer 106, refer to FIG. 2 to be described later) to sense a magnetic field.

A cross-sectional structure of the magnetic sensor 1 will be described in detail later.

Here, the hard magnetic material has a large, so-called coercive force, the hard magnetic material being once magnetized by an external magnetic field, even upon removal of the external magnetic field, maintaining the magnetized state. On the other hand, the soft magnetic material has a small, so-called coercive force, the soft magnetic material being easily magnetized by an external magnetic field, but, upon removal of the external magnetic field, quickly returning to a state with no magnetization or a little magnetization.

Note that, in the present specification, an element constituting the magnetic sensor 1 (the thin film magnet 20 or the like) is indicated by a two-digit number, and a layer processed into an element (the hard magnetic material layer 103 or the like) is indicated by a number of one hundreds. Then, for a figure indicating an element, a figure indicating a layer processed into the element is written in parentheses in some cases. For example, the case of the thin film magnet 20 is written as the thin film magnet 20 (the hard magnetic material layer 103). In the figure, the case is written as 20 (103). The same is true in other cases.

Description will be given of a planar structure of the magnetic sensor 1 by FIG. 1A. The magnetic sensor 1 has a quadrangular planar shape as an example. Here, the sensitive part 30 and yokes 40 formed at the uppermost portion of the magnetic sensor 1 will be described.

The sensitive part 30 includes: plural sensitive elements 31; connection parts 32 windingly performing serial connection of the adjacent sensitive elements 31; and terminal parts 33 to which electric wires are connected to supply the electrical current. In the sensitive part 30 of the magnetic sensor 1 shown in FIG. 1A, four sensitive elements 31 are arranged so that the longitudinal directions thereof are in parallel with one another. The sensitive element 31 serves as a magneto-impedance effect element.

The sensitive element 31 has, for example, the length in the longitudinal direction of 1 mm to 2 mm, and the width in the short direction of 50 μm to 150 μm. In addition, spacings between the adjacent sensitive elements 31 are 50 μm to 150 μm.

The connection part 32 is provided between end portions of the adjacent sensitive elements 31 and windingly performs serial connection of the adjacent sensitive elements 31. In the magnetic sensor 1 shown in FIG. 1A, four sensitive elements 31 are disposed in parallel, and therefore there are three connection parts 32. The number of connection parts 32 differs depending on the number of sensitive elements 31. For example, if there are three sensitive elements 31, there are two connection parts 32. Moreover, if there is one sensitive element 31, no connection part 32 is provided. Note that the width of the connection part 32 may be set in accordance with the magnitude of the pulse voltage to be applied to the sensitive part 30 by a voltage application part 3. For example, the width of the connection part 32 may be the same as that of the sensitive element 31.

The terminal parts 33 are provided to the (two) respective end portions of the sensitive parts 31, the end portions not being connected to the connection parts 32. The terminal part 33 may have a size capable of connecting the electric wires. Note that, in the sensitive part 30 of the exemplary embodiment, since there are four sensitive elements 31, the two terminal parts 33 are provided on the left side in FIG. 1A. In the case where the number of sensitive elements 31 is an odd number, two terminal parts 33 may be provided into right and left.

Further, the magnetic sensor 1 includes yokes 40 each of which is provided to face the end portions of the sensitive elements 31 in the longitudinal direction thereof. Here, there are provided two yokes 40a and 40b, each of which is provided to face each of both end portions of the sensitive elements 31 in the longitudinal direction thereof. Note that, in the case where the yokes 40a and 40b are not distinguished, the yokes are referred to as yokes 40. The yoke 40 guides magnetic force lines to the end portion of the sensitive element 31 in the longitudinal direction thereof. Therefore, the yokes 40 are constituted by a soft magnetic material (the soft magnetic material layer 105) through which the magnetic force lines are likely to pass. Note that, in the case where the magnetic force lines sufficiently pass in the longitudinal direction of the sensitive element 31, it is unnecessary to provide the yokes 40.

From above, the size of the magnetic sensor 1 is several millimeters square in the planar shape. Note that the size of the magnetic sensor 1 may be other values.

Next, with reference to FIG. 1B, the cross-sectional structure of the magnetic sensor 1 will be described. The magnetic sensor 1 is configured by disposing (laminating) an adhesive layer 101, a control layer 102, the hard magnetic material layer 103 (the thin film magnet 20), a dielectric layer 104, the sensitive part 30 formed of the soft magnetic material layer 105 and the non-magnetic material layer 106, and the yokes 40 formed of the soft magnetic material layer 105 in this order on the non-magnetic substrate 10.

The substrate 10 is composed of a non-magnetic material; for example, an oxide substrate, such as glass or sapphire, a semiconductor substrate, such as silicon, or a metal substrate, such as aluminum, stainless steel, or a nickel-phosphorus-plated metal, can be provided.

The adhesive layer 101 is a layer for improving adhesiveness of the control layer 102 to the substrate 10. As the adhesive layer 101, it is preferable to use an alloy containing Cr or Ni. Examples of the alloy containing Cr or Ni include CrTi, CrTa and NiTa. The thickness of the adhesive layer 101 is, for example, 5 nm 50 nm. Note that, if there is no problem in adhesiveness of the control layer 102 to the substrate 10, it is unnecessary to provide the adhesive layer 101. Note that, in the present specification, composition ratios of alloys containing Cr or Ni are not shown. The same applies hereinafter.

The control layer 102 is a layer controlling the magnetic anisotropy of the thin film magnet 20 constituted by the hard magnetic material layer 103 to be likely to express in the in-plane direction of the film. As the control layer 102, it is preferable to use Cr, Mo or W, or an alloy containing thereof (hereinafter, referred to as an alloy containing Cr or the like to constitute the control layer 102). Examples of the alloy containing Cr or the like to constitute the control layer 102 include CrTi, CrMo, CrV and CrW. The thickness of the control layer 102 is, for example, 10 nm 300 nm.

It is preferable that the hard magnetic material layer 103 constituting the thin film magnet 20 uses an alloy that contains Co as a main component and also contains at least one of Cr and Pt (hereinafter, referred to as a Co alloy constituting the thin film magnet 20). Examples of the Co alloy constituting the thin film magnet 20 include CoCrPt, CoCrTa, CoNiCr and CoCrPtB. Note that Fe may be contained. The thickness of the hard magnetic material layer 103 is, for example, 1 μm to 3 μm.

The alloy containing Cr or the like to constitute the control layer 102 has a bcc (body-centered cubic) structure. Consequently, the hard magnetic material constituting the thin film magnet 20 (the hard magnetic material layer 103) preferably has an hcp (hexagonal close-packed) structure easily causing crystal growth on the control layer 102 composed of the alloy containing Cr or the like having the bcc structure. When crystal growth of the hard magnetic material layer 103 having the hcp structure is caused on the bcc structure, the c-axis of the hcp structure is likely to be oriented in a plane. Therefore, the thin film magnet 20 configured with the hard magnetic material layer 103 is likely to have the magnetic anisotropy in the in-plane direction. Note that the hard magnetic material layer 103 is polycrystalline composed of a set of different crystal orientations, and each crystal has the magnetic anisotropy in the in-plane direction. The magnetic anisotropy is derived from crystal magnetic anisotropy.

Note that, to promote the crystal growth of the alloy containing Cr or the like to constitute the control layer 102 and the Co alloy constituting the thin film magnet 20, the substrate 10 may be heated to 100° C. to 600° C. By the heating, the crystal growth of the alloy containing Cr or the like constituting the control layer 102 is likely to be caused, and thereby crystalline orientation is likely to be provided so that the hard magnetic material layer 103 having the hcp structure includes an axis of easy magnetization in a plane. In other words, the magnetic anisotropy is likely to be imparted in a plane of the hard magnetic material layer 103.

The dielectric layer 104 is configured with a nonmagnetic dielectric material and electrically insulates the thin film magnet 20 and the sensitive part 30. Examples of the dielectric material constituting the dielectric layer 104 include oxide, such as $SiO_2$, $Al_2O_3$, or $TiO_2$, or nitride, such as $Si_3N_4$ or AlN. In addition, the thickness of the dielectric layer 104 is, for example, 0.1 μm to 30 μm.

Figure 2:
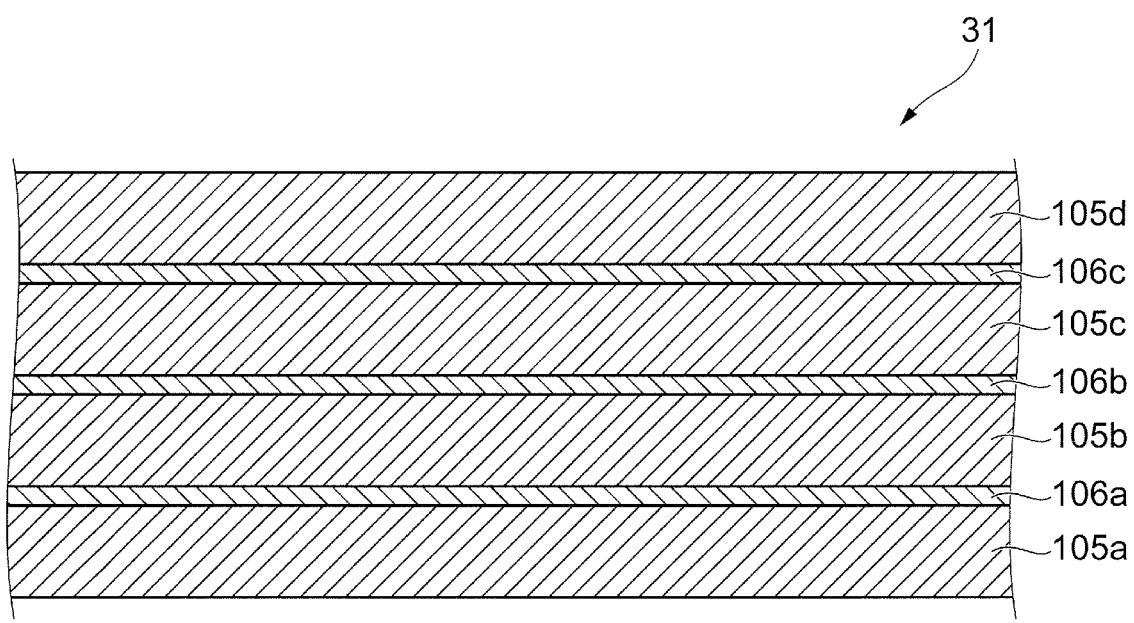
FIG. 2 is a diagram illustrating a configuration of a sensitive element to which the exemplary embodiment is applied.

Each sensitive element 31 of the sensitive part 30 is configured by alternately laminating three or more soft magnetic material layers 105 and two or more (in other words, plural) non-magnetic material layers 106. FIG. 2 is a diagram illustrating the configuration of the sensitive element 31 to which the exemplary embodiment is applied, and is an enlarged cross-sectional view of the sensitive element 31 in the magnetic sensor 1 shown in FIG. 1B.

In the example shown in FIG. 2, in the sensitive element 31, the four soft magnetic material layers 105a, 105b, 105c, and 105d, and the three non-magnetic material layers 106a, 106b, and 106c are alternately laminated. Note that, in the description of the exemplary embodiment, in the case where the four soft magnetic material layers 105a to 105d and the three non-magnetic material layers 106a to 106c are not distinguished from one another, those layers are referred to as the soft magnetic material layers 105 and the non-magnetic material layers 106, respectively.

In addition, as shown in FIG. 2, a lowermost layer and an uppermost layer of the sensitive element 31 are configured with the soft magnetic material layers 105. In other words, in the sensitive element 31, the non-magnetic layers 106 are laminated among the plural soft magnetic material layers 105.

In the magnetic sensor 1 of the exemplary embodiment, three or more soft magnetic material layers 105 are required to achieve the effect. In addition, from the standpoint of the thickness of the sensitive element 31 and the manufacturing cost, it is preferable that the number of soft magnetic material layers 105 is 20 or less.

In the sensitive element 31, the soft magnetic material layers 105 facing each other with the non-magnetic material layer 106 interposed therebetween are antiferromagnetically coupled (AFC) by the action of the non-magnetic material layer 106. More specifically, in the sensitive element 31, the soft magnetic material layer 105a and the soft magnetic material layer 105b facing each other with the non-magnetic material layer 106a interposed therebetween are antiferromagnetically coupled, the soft magnetic material layer 105b and the soft magnetic material layer 105c facing each other with the non-magnetic material layer 106b interposed therebetween are antiferromagnetically coupled, and the soft magnetic material layer 105c and the soft magnetic material layer 105d facing each other with the non-magnetic material layer interposed therebetween are antiferromagnetically coupled.

As the soft magnetic material layer 105, it is preferable to use an amorphous alloy, which is an alloy containing Co as a main component doped with a high melting point metal, such as Nb, Ta or W (hereinafter, referred to as a Co alloy constituting the soft magnetic material layer 105). Examples of the Co alloy constituting the soft magnetic material layer 105 include CoNbZr, CoFeTa and CoWZr.

In addition, the thickness of each soft magnetic material layer 105 can be set in a range of 1 nm or more and 250 nm or less, and it is preferable to be set in a range of 10 nm or more and 125 nm or less.

As the non-magnetic material layer 106, a non-magnetic transition metal having an effect of antiferromagnetically coupling the soft magnetic material layers 105 facing each other with the non-magnetic material layer 106 interposed therebetween can be used; specific examples thereof include metals such as Ru, Re, Cr, and Cu, or an alloy containing these metals, and it is preferable to use Ru or an Ru alloy.

In addition, the thickness of each non-magnetic material layer 106 differs depending on materials constituting the non-magnetic material layer 106; however, in the case of using Ru, the thickness can be set in the range of 0.6 nm or more and 1.4 nm or less, and it is preferable to set the thickness in the range of 0.8 nm or more and 1.2 nm or less. In the case where the thickness of the non-magnetic material layer 106 falls outside the range, the antiferromagnetic coupling energy of the soft magnetic material layers 105 facing each other with the non-magnetic material layer 106 interposed therebetween is sometimes decreased. In this case, a closure magnetic domain, which will be described later, is easily formed in the sensitive element 31.

The sensitive element 31 is provided with uniaxial magnetic anisotropy in a direction crossing the longitudinal direction, for example, the short direction intersecting the longitudinal direction (in other words, the width direction of the sensitive element 31). Note that the direction crossing the longitudinal direction may have an angle exceeding 45° with respect to the longitudinal direction.

Returning to FIGS. 1A and 1B, a conductor layer 107 constituting the connection part 32 and the terminal part 33 may be a conductor with excellent conductivity, and, for example, Ag, Cu, Au or Al can be used, but not particularly limited. In addition, the connection part 32 and the terminal part 33 may be configured with the soft magnetic material layer 105 and the non-magnetic material layer 106 that are formed integrally with the sensitive element 31.

In the magnetic sensor 1 of the exemplary embodiment, the adhesive layer 101, the control layer 102, the hard magnetic material layer 103 and the dielectric layer 104 are processed to have a quadrangular planar shape (refer to FIG. 1). Then, of the exposed side surfaces, in the two facing side surfaces, the thin film magnet 20 serves as the north pole ((N) in FIG. 1B) and the south pole ((S) in FIG. 1B). Note that the line connecting the north pole and the south pole of the thin film magnet 20 takes the longitudinal direction of the sensitive element 31 in the sensitive part 30. Here, to take the longitudinal direction means that an angle formed by the line connecting the north pole and the south pole and the longitudinal direction is less than 45°. Note that the smaller the angle formed by the line connecting the north pole and the south pole and the longitudinal direction, the better.

In the magnetic sensor 1, the lines of magnetic force outputted from the north pole of the thin film magnet 20 once go to the outside of the magnetic sensor 1. Then, a part of the lines of magnetic force passes through the sensitive element 31 via the yoke 40a and goes to the outside again via the yoke 40b. The lines of magnetic force that have passed through the sensitive element 31 return to the south pole of the thin film magnet 20 together with the lines of magnetic force that have not passed through the sensitive element 31. In other words, the thin film magnet 20 applies the magnetic field (the bias magnetic field Hb to be described later) to the longitudinal direction of the sensitive element 31.

Note that the north pole and the south pole of the thin film magnet 20 are collectively referred to as both magnetic poles, and when the north pole and the south pole are not distinguished, they are referred to as a magnetic pole.

Note that, as shown in FIG. 1A, the yoke 40 (the yokes 40a and 40b) is configured so that the shape thereof as viewed from the front surface side of the substrate 10 is narrowed as approaching the sensitive part 30. This is to concentrate the magnetic field to (to gather the magnetic force lines on) the sensitive part 30. In other words, the magnetic field in the sensitive part 30 is strengthened to further improve the sensitivity. Note that the width of the portion of the yoke 40 (the yokes 40a and 40b) facing the sensitive part 30 may not be narrowed.

Here, the interval between the yoke 40 (the yokes 40a and 40b) and the sensitive parts 30 may be, for example, 1 μm to 100 μm.

(Action of Magnetic Sensor 1)

Figure 3:
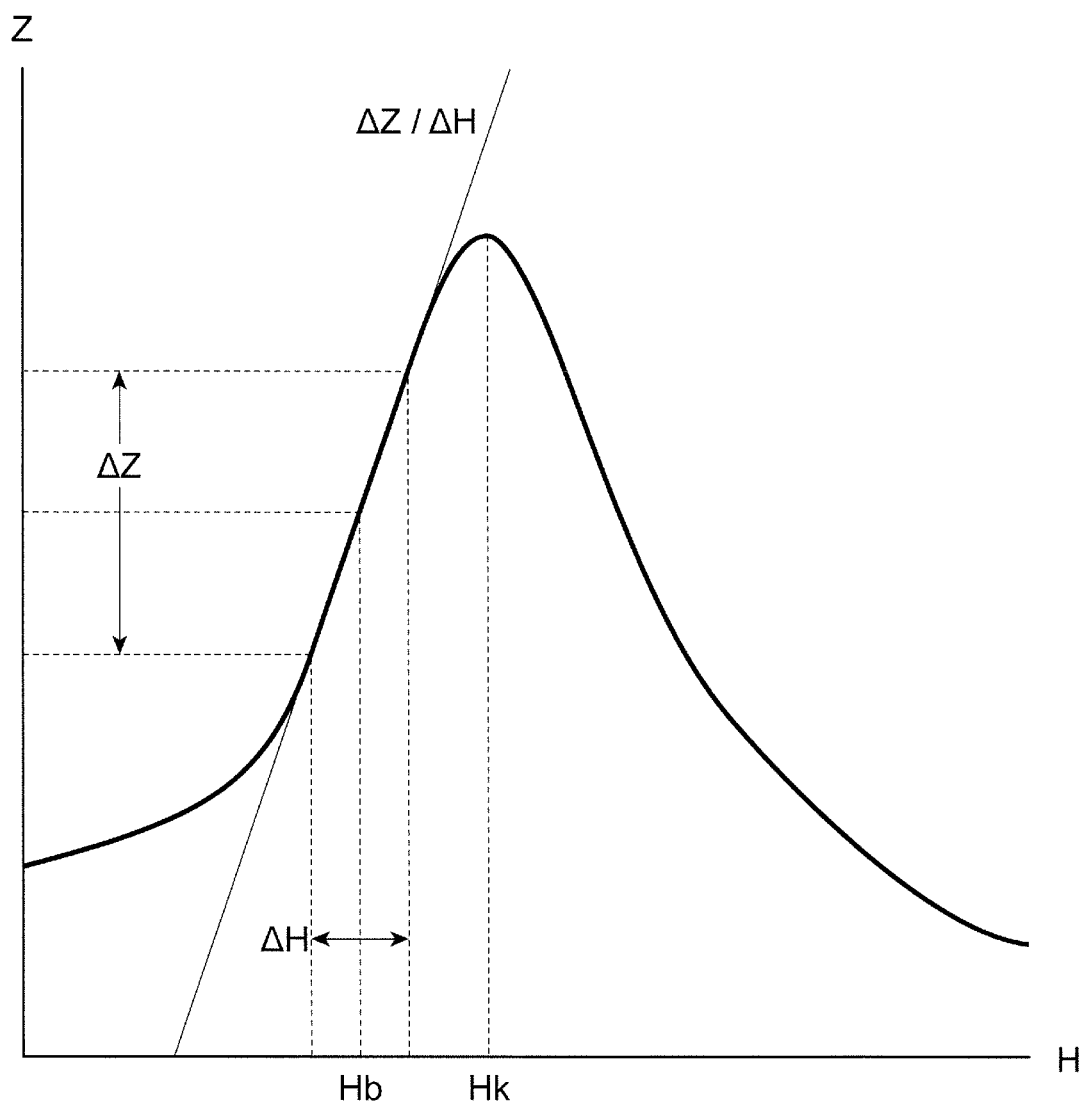
FIG. 3 is a diagram illustrating a relation between a magnetic field applied in the longitudinal direction of the sensitive element in a sensitive part of the magnetic sensor and an impedance of the sensitive part.

Subsequently, action of the magnetic sensor 1 will be described. FIG. 3 is a diagram illustrating a relationship between the magnetic field applied in the longitudinal direction of the sensitive element 31 in the sensitive part 30 of the magnetic sensor 1 and the impedance of the sensitive part 30. In FIG. 3, the horizontal axis indicates the magnetic field H, and the vertical axis indicates the impedance Z. The impedance Z of the sensitive part 30 is measured by passing a high-frequency current between two terminal parts 33.

As shown in FIG. 3, the impedance Z of the sensitive part 30 is increased as the magnetic field H applied to the longitudinal direction of the sensitive element 31 is increased. Within the range in which the magnetic field H to be applied is smaller than the anisotropic magnetic field Hk of the sensitive element 31, by use of a portion where the amount of change ΔZ in the impedance Z with respect to the amount of change ΔH in the magnetic field H is steep (ΔZ/ΔH is large), it is possible to extract extremely weak change in the magnetic field H as the amount of change ΔZ in the impedance Z. In FIG. 3, the center of the magnetic field H where ΔZ/ΔH is large is shown as the magnetic field Hb. In other words, it is possible to measure the amount of change (ΔH) in the magnetic field H in the vicinity to the magnetic field Hb (the range indicated by arrows in FIG. 3) with high accuracy. The magnetic field Hb is referred to as a bias magnetic field in some cases.

(Potential Problem in Conventional Magnetic Sensor)

By the way, in a conventional magnetic sensor including the sensitive element 31 as the magnetic impedance effect element, depending on the lamination structure of the sensitive element 31, the S/N ratio, which is the ratio of the signal and the noise at the output from the magnetic sensor, was sometimes reduced. For example, in the case where the sensitive element 31 is configured with a single soft magnetic material layer, or in the case where a single non-magnetic material layer is laminated between two soft magnetic material layers, the S/N ratio is sometimes reduced. This is estimated because the closure magnetic domain (details thereof will be described later) showing an annular magnetization direction is formed in the sensitive element 31, and, in the vicinity of the magnetic field Hb, the magnetic domain walls constituting the closure magnetic domain are displaced with the change in the magnetic field H.

Hereinafter, specific description will be given of a phenomenon that the S/N ratio of the magnetic sensor is reduced by the closure magnetic domain formed in the sensitive element 31.

FIGS. 4A to 4D are diagrams illustrating, in the conventional magnetic sensor, a relation between strength of the magnetic field H applied to the sensitive element 31 and the change in the magnetic domain in the sensitive element 31. Note that, here, it is assumed that the uniaxial magnetic anisotropy has already been imparted in the short direction of the sensitive element 31 in the initial state where the magnetic field H is 0.

FIG. 4A shows an example of the magnetic domain structure of the sensitive element 31 in a very weak state where the magnetic field H is close to 0 (referred to as an "initial magnetic permeability range," details of which will be described later). FIG. 4B shows an example of the magnetic domain structure of the sensitive element 31 in a state where the magnetic field H is stronger than the state shown in FIG. 4A (referred to as an "irreversible magnetic domain wall displacement range," details of which will be described later). FIG. 4C shows an example of the magnetic domain structure of the sensitive element 31 in a state where the magnetic field H is stronger than the state shown in FIG. 4B (referred to as a "rotational magnetization range," details of which will be described later). FIG. 4D shows an example of the magnetic domain structure of the sensitive element 31 in a state where the magnetic field H is stronger than the state shown in FIG. 4C (referred to as "saturation," details of which will be described later).

Figure 5:
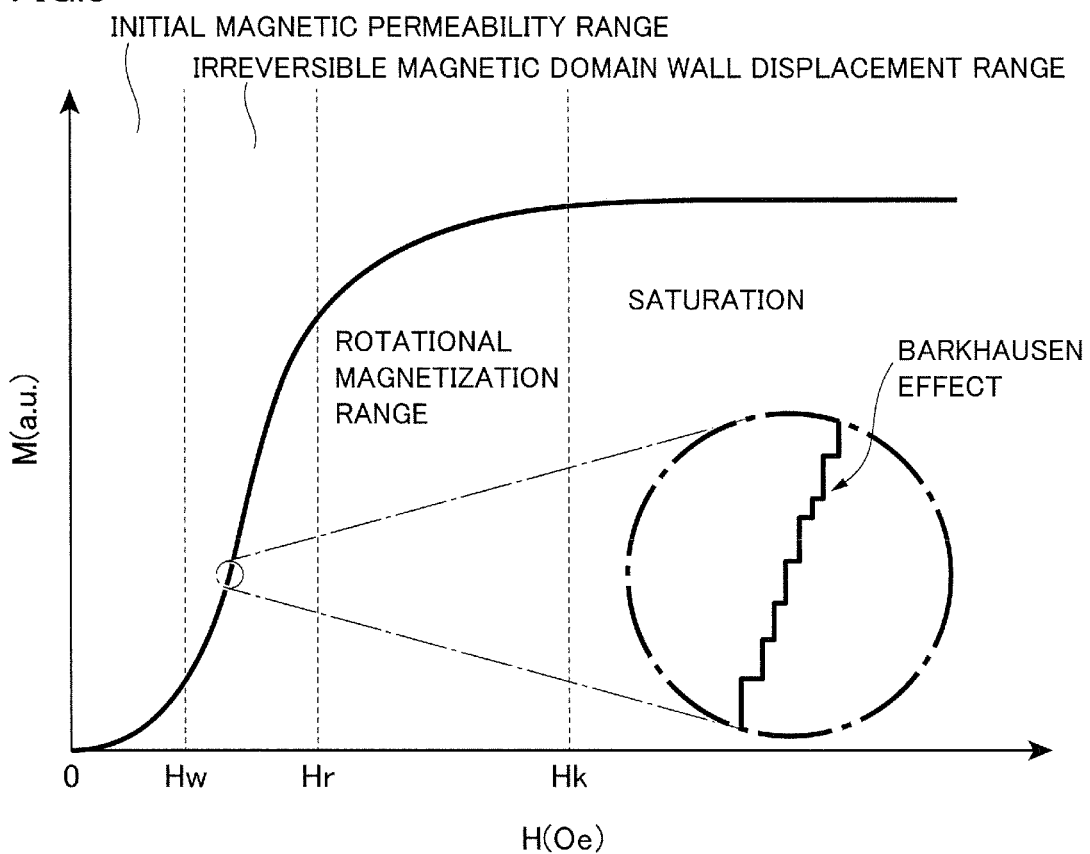
FIG. 5 is a diagram illustrating a relation between strength of a magnetic field applied to the sensitive element and intensity of magnetization in the sensitive element.

FIG. 5 is a diagram illustrating a relation between the strength of the magnetic field applied to the sensitive element 31 and intensity of the magnetization in the sensitive element 31. In FIG. 5, the horizontal axis indicates the magnetic field H (Oe), and the vertical axis indicates the magnetization M (a.u.). Note that FIG. 5 also shows a relation among the magnetic field H, the magnetization M, and the above-described "initial magnetic permeability range," "irreversible magnetic domain wall displacement range," "rotational magnetization range," and "saturation."

The range of the magnetic field H, which is applied to the sensitive element 31 from the outside, from 0 to a magnetic domain wall displacing magnetic field Hw (details thereof will be described later) is referred to as the "initial magnetic permeability range."

Within the initial magnetic permeability range, in the sensitive element 31, plural magnetic domains with respective different directions of the magnetization M are formed. To describe more specifically, the sensitive element 31 includes a first magnetic domain D1 and a second magnetic domain D2 with the direction of the magnetization M toward a direction of the easy axis of magnetization (the short direction), and a third magnetic domain D3 and a fourth magnetic domain D4 with the direction of the magnetization M toward a direction of the hard axis of magnetization (the longitudinal direction). At this time, the first magnetic domain D1 and the second magnetic domain D2 are opposite in direction to each other, and the third magnetic domain D3 and the fourth magnetic domain D4 are also opposite in direction to each other. Then, the four magnetic domains are disposed in a circular manner in the clockwise direction in the figure, from "first magnetic domain D1" to "third magnetic domain D3" to "second magnetic domain D2" to "fourth magnetic domain D4" to "first magnetic domain D1." As a result, these four magnetic domains form a closure magnetic domain showing an annular-shaped direction of the magnetization M as a whole.

From a macroscopic point of view, in the sensitive element 31, plural closure magnetic domains are arranged along the longitudinal direction. Then, in each closure magnetic domain, based on the relation between the above-described easy axis of magnetization and hard axis of magnetization, each area of the first magnetic domain D1 and the second magnetic domain D2 along the easy axis of magnetization is larger than each area of the third magnetic domain D3 and the fourth magnetic domain D4 along the hard axis of magnetization.

Then, in the initial magnetic permeability range, each magnetic domain constituting each closure magnetic domain is maintained intact with respect to the change in the magnetic field H. In other words, in the case where the magnetic field H is between 0 and the magnetic domain wall displacing magnetic field Hw, even if the magnetic field H increases, the magnetic domain structure shown in FIG. 4A remains unchanged.

The range of the magnetic field H, which is applied to the sensitive element 31 from the outside, from the magnetic domain wall displacing magnetic field Hw to a magnetized rotating magnetic field Hr (details thereof will be described later) is referred to as the "irreversible magnetic domain wall displacement range."

When the magnetic field H exceeds the magnetic domain wall displacing magnetic field Hw, which is determined based on the properties of the soft magnetic material layer 105 (the material, structure, dimensions, etc.) constituting the sensitive element 31, in each closure magnetic domain, the magnetic domain wall displacement occurs, in which the positions of the magnetic domain walls existing between the adjacent magnetic domains are displaced by the action of the magnetic field H. At this time, in each closure magnetic domain, the magnetic domain walls existing between the fourth magnetic domain D4, the direction of the magnetization M of which is the same as that of the magnetic field H, and the first and second magnetic domains D1 and D2 adjacent to the fourth magnetic domain D4 are displaced to the side that increases the area of the fourth magnetic domain D4. In addition, the magnetic domain walls existing between the third magnetic domain D3, the direction of the magnetization M of which is opposite to that of the magnetic field H, and the first and second magnetic domains D1 and D2 adjacent to the third magnetic domain D3 are displaced to the side that decreases the area of the third magnetic domain D3. As a result, the area of the fourth magnetic domain D4 is increased as compared to that in the initial magnetic permeability range shown in FIG. 4A, and each area of the remaining first magnetic domain D1 through the third magnetic domain D3 is decreased as compared to that in the initial magnetic permeability range.

Moreover, displacement of the magnetic domain walls in the irreversible magnetic domain wall displacement range discontinuously occurs as the magnetic field H increases. As a result, the change in the magnetization M in the sensitive element 31 on the whole with respect to the magnetic field H is in a stepwise (jagged) manner, not in a linear or curved manner, as shown in FIG. 5 with a main part being enlarged. Note that such a relation between the magnetic field H and the magnetization M is called the Barkhausen effect.

Then, in the irreversible magnetic domain wall displacement range, the state, in which the area ratio of each magnetic domain constituting each closure magnetic domain gradually changes with respect to the change in the magnetic field H, continues. To describe more specifically, in the case where the magnetic field H exists between the magnetic domain wall displacing magnetic field Hw and the magnetized rotating magnetic field Hr, the area of the fourth magnetic domain D4 increases little by little as the magnetic field H increases, and the area of each of the first magnetic domain D1 to the third magnetic domain D3 decreases little by little.

The range of the magnetic field H, which is applied from the outside, reaching the anisotropic magnetic field Hk from the magnetized rotating magnetic field Hr is referred to as a "rotational magnetization range."

When the magnetic field H exceeds the magnetized rotating magnetic field Hr, which is determined based on the properties of the soft magnetic material layer 105 (the material, structure, dimensions, etc.) constituting the sensitive element 31, in each closure magnetic domain, magnetization rotation occurs, in which, while the positions of the magnetic domain walls existing between the adjacent magnetic domains are substantially fixed, in each of the first to third magnetic domains D1 to D3 with the directions of the magnetization M different from the direction of the magnetic field H, the direction of the magnetization M gradually rotates to face toward the same side of the direction of the magnetic field H. At this time, the fourth magnetic domain D4 remains intact because the direction of magnetization thereof has already been consistent with the direction of the magnetic field H.

Then, in the rotational magnetization range, the state, in which the area ratio of each magnetic domain constituting each closure magnetic domain is almost unchanged with respect to the change in the magnetic field H, whereas the directions of the magnetization M in the first to third magnetic domains D1 to D3 gradually change, continues. To describe more specifically, in the case where the magnetic field H exists between the magnetized rotating magnetic field Hr and the anisotropic magnetic field Hk, the direction of the magnetization M in the fourth magnetic domain D4 does not change as the magnetic field H increases, but the directions of the magnetization M in each of the first magnetic domain D1 to the third magnetic domain D3 gradually rotate toward the side that is coincide with the direction of the magnetic field H.

However, in the rotational magnetization range, the rotation of the direction of the magnetization M in each of the first to third magnetic domains D1 to D3 occurs continuously. Consequently, in the rotational magnetization range, the change in the magnetization M in the sensitive element 31 on the whole with respect to the magnetic field H is, as shown in FIG. 5, in the curved manner. Then, in the rotational magnetization range, the increase in the magnetization M in the sensitive element 31 on the whole with respect to the increase in the magnetic field H is slowed down with the increase in the magnetic field H, and becomes substantially flat in the vicinity of the anisotropic magnetic field Hk with the maximum value.

The region of the magnetic field H, which is applied from the outside, exceeding the anisotropic magnetic field Hk is referred to as "saturation."

When the magnetic field H exceeds the above-described anisotropic magnetic field Hk, the direction of the magnetization M in each closure magnetic domain is aligned with the direction of the magnetic field H, namely, the direction of the magnetization M in the fourth magnetic domain D4. As a result, the magnetic domain wall that existed between the adjacent magnetic domains disappears, and thereby the sensitive element 31 is formed by a magnetic domain (a single magnetic domain).

Moreover, in the saturation, as the magnetic domain structure has changed from a configuration including plural closure magnetic domains to a configuration including a single magnetic domain, the magnetization M in the sensitive element 31 as a whole does not change in response to the change in the magnetic field H, thus taking substantially a constant value.

Usually, in a magnetic sensor, the magnitude of the bias magnetic field Hb is set at the irreversible magnetic domain wall displacement range where the amount of change ΔM in the magnetization M with respect to the amount of change ΔH in the magnetic field H is large (in other words, the amount of change ΔZ in the impedance Z with respect to the amount of change ΔH in the magnetic field H is large). Then, in the irreversible magnetic domain wall displacement range, when the closure magnetic domain is formed in the sensitive element 31, as the magnetic field H changes, the Barkhausen effect, in which the magnetic domain walls constituting the closure magnetic domain are displaced in a stepwise and discontinuous manner, is generated. It is estimated that the discontinuous displacement of the magnetic domain walls in the sensitive element 31 cause noise, and the S/N ratio at the output obtained from the magnetic sensor is reduced.

Therefore, to reduce the noise associated with the discontinuous displacement of the magnetic domain walls and to suppress the decrease in the S/N ratio at the output obtained from the magnetic sensor, it is preferable to enlarge the magnetic domains formed on the sensitive element 31 to prevent formation of the closure magnetic domain in the sensitive element 31.

(Magnetic Domain Structure of Sensitive Element 31 in the Exemplary Embodiment)

In contrast thereto, in the magnetic sensor 1 of the exemplary embodiment, as described above, the closure magnetic domain is hardly formed in the sensitive element 31 by the structure of the sensitive element 31 in which the three or more soft magnetic material layers 105 and the two or more non-magnetic material layers 106 are alternately laminated.

Hereinafter, the magnetic domain structure of the sensitive element 31 to which the exemplary embodiment is applied will be described in comparison with the conventional sensitive element 31.

Figure 6:
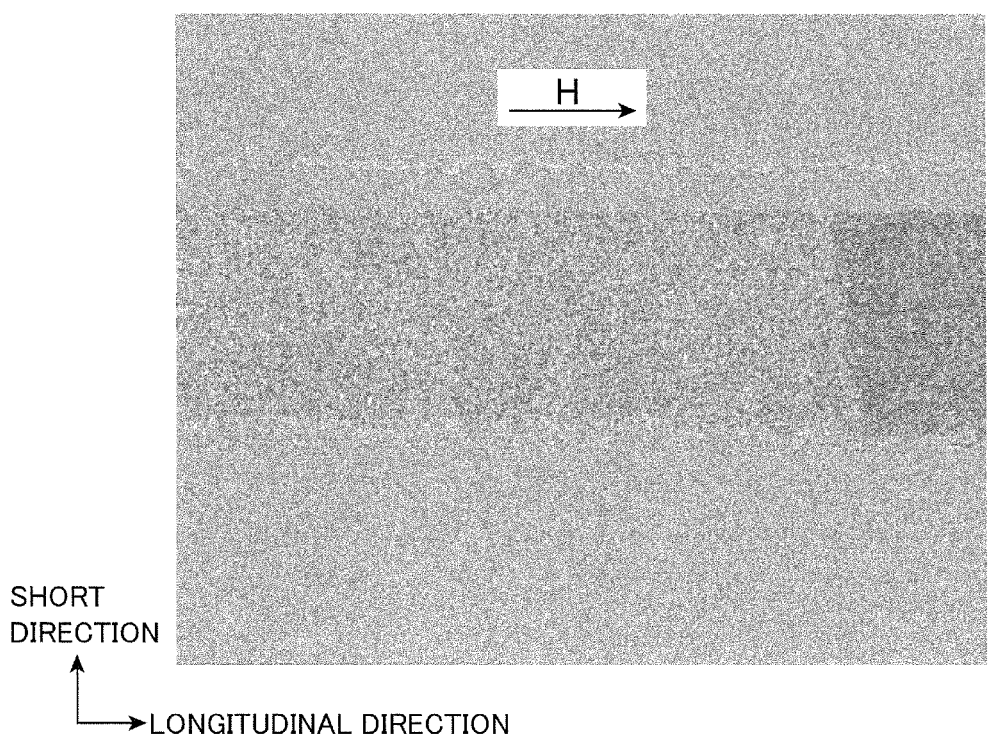
FIG. 6 is a photograph obtained by shooting a state of a magnetic domain in the sensitive element having the lamination structure shown in FIG. 2, to which the exemplary embodiment is applied.
Figure 7A:
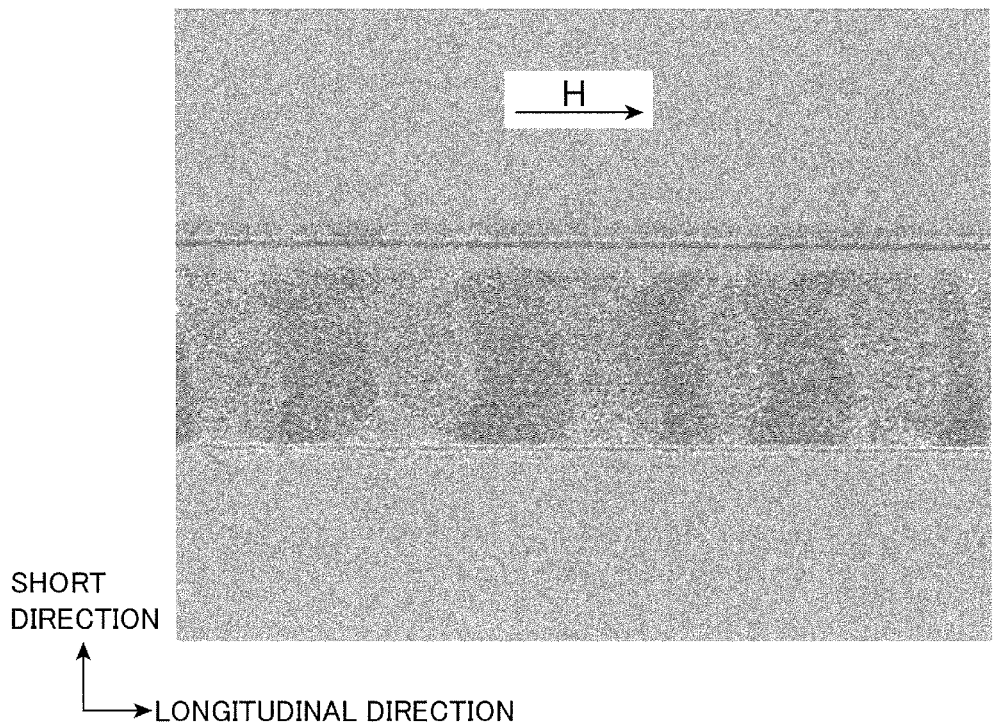
FIGS. 7A and 7B are photographs obtained by shooting a state of a magnetic domain in a conventional sensitive element.
Figure 7B:
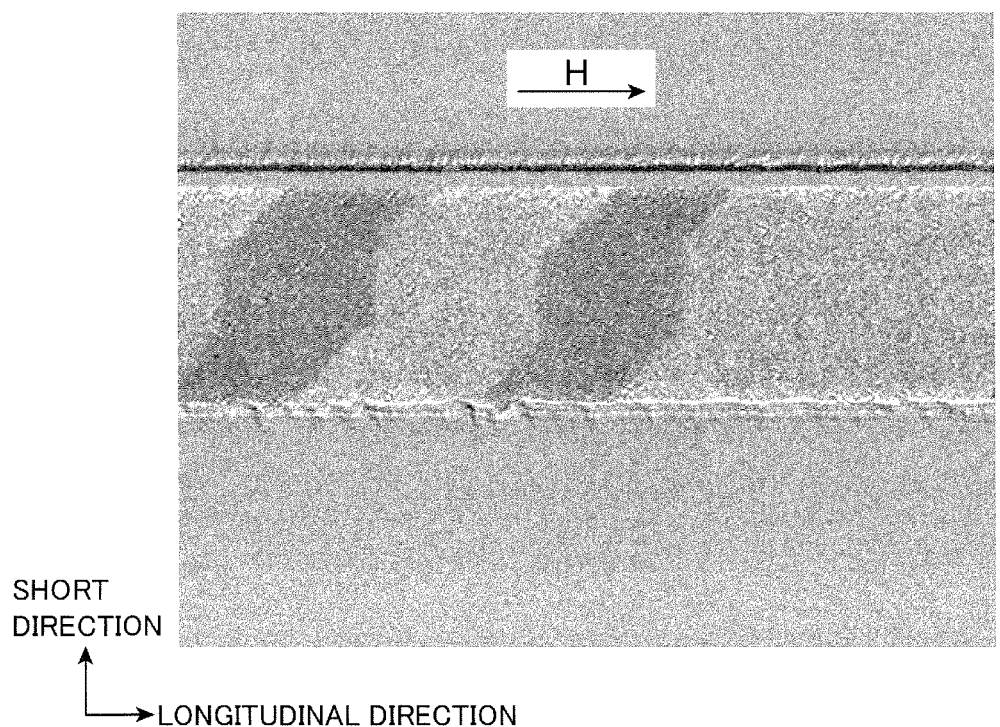

FIG. 6 is a photograph obtained by shooting a state of the magnetic domain in the sensitive element 31, to which the exemplary embodiment is applied, having the lamination structure shown in FIG. 2. In addition, FIGS. 7A and 7B are photographs obtained by shooting states of the magnetic domain in the conventional sensitive element 31. Here, FIGS. 6, 7A and 7B show the states of the magnetic domain when the magnetic field H of +0.5 Oe is applied to the sensitive element 31. Moreover, FIGS. 6, 7A and 7B were taken by using Neomagnesia Lite manufactured by NEOARK CORPORATION.

In FIG. 6, the thickness of each soft magnetic material layer 105 is 0.25 μm, and the thickness of each non-magnetic material layer 106 is 1.0 nm, the soft magnetic material layers 105 and the non-magnetic material layers 106 constituting the sensitive element 31. FIG. 7A shows, as the conventional sensitive element 31, the state of the magnetic domain in the case where the sensitive element 31 is configured with the single soft magnetic material layer 105 with the thickness of 1.0 μm. FIG. 7B shows, as the conventional sensitive element 31, the state of the magnetic domain in the case where the sensitive element 31 is configured with the two soft magnetic material layers 105 with the thickness of 0.5 μm and the single non-magnetic material layer 106 with the thickness of 1.0 nm laminated therebetween. In addition, in the sensitive element 31 shown in FIGS. 6, 7A and 7B, $Co_{85}Nb_{12}Zr_3$ is used as the soft magnetic material layer 105, and Ru is used as the non-magnetic material layer 106.

As shown in FIGS. 7A and 7B, in the case where the sensitive element 31 is configured with the single soft magnetic material layer 105, or in the case where the sensitive element 31 is configured with the two soft magnetic material layers 105 and the single non-magnetic material layer 106 laminated therebetween, it can be seen that the plural magnetic domains (corresponding to the first magnetic domain D1 and the second magnetic domain D2) are arranged in the longitudinal direction, each of which is located along the short direction of the sensitive element 31. It can also be seen that, on both end portions of the sensitive element 31 in the short direction, the plural magnetic domains (corresponding to the third magnetic domain D3 and the fourth magnetic domain D4) are arranged in the longitudinal direction, each of which is located along the longitudinal direction of the sensitive element 31. In this example, it is considered that, in the sensitive element 31 shown in FIGS. 7A and 7B, the closure magnetic domain is formed as shown in FIG. 4A.

Then, in the conventional magnetic sensor including the sensitive element 31 with such a closure magnetic domain having been formed, it is estimated that the noise associated with the discontinuous displacement of the magnetic domain walls constituting the closure magnetic domain is generated, and the S/N ratio at the output obtained from the magnetic sensor is reduced, as described above.

On the other hand, as shown in FIG. 6, in the sensitive element 31 of the exemplary embodiment, though the two magnetic domains arranged in the longitudinal direction of the sensitive element 31 are formed, the magnetic domains, each of which is located along the longitudinal direction of the sensitive element 31 (corresponding to the third magnetic domain D3 and the fourth magnetic domain D4 in FIG. 4), are not formed. To additionally describe, in the sensitive element 31 of the exemplary embodiment, the closure magnetic domain showing annular-shaped direction of the magnetization M is not formed.

Consequently, it can be understood that, in the magnetic sensor 1 of the exemplary embodiment including such a sensitive element 31, the noise associated with the discontinuous displacement of the magnetic domain walls constituting the closure magnetic domain is suppressed, and thereby the reduction in the S/N ratio at the output from the magnetic sensor 1 can be suppressed.

(Manufacturing Method of Magnetic Sensor 1)

Next, an example of the manufacturing method of the magnetic sensor 1 will be described.

As described above, the substrate 10 is composed of a non-magnetic material; for example, an oxide substrate, such as glass or sapphire, a semiconductor substrate, such as silicon, or a metal substrate, such as aluminum, stainless steel, or a nickel-phosphorus-plated metal, can be provided. On the substrate 10, for example, streaky grooves or streaky asperities with the radius of curvature Ra of 0.1 nm to 100 nm may be provided by use of a polisher or the like. Note that it is preferable to provide the streaks of the streaky grooves or the streaky asperities in a direction connecting the north pole and the south pole of the thin film magnet 20 configured with the hard magnetic material layer 103. By doing so, the crystal growth in the hard magnetic material layer 103 is promoted in the direction of the grooves. Consequently, the axis of easy magnetization of the thin film magnet 20 configured with the hard magnetic material layer 103 is more likely to face the groove direction (the direction connecting the north pole and the south pole of the thin film magnet 20). In other words, magnetization of the thin film magnet 20 is made easier.

Here, as an example, the substrate 10 will be described as glass having a diameter of about 95 mm and a thickness of about 0.5 mm. In the case where the planar shape of the magnetic sensor 1 is several millimeters square, plural magnetic sensors 1 are collectively manufactured on the substrate 10, and thereafter, divided (cut) into individual magnetic sensors 1.

After washing the substrate 10, on one of the surfaces (hereinafter, referred to as a front surface) of the substrate 10, the adhesive layer 101, the control layer 102, the hard magnetic material layer 103 and the dielectric layer 104 are deposited (accumulated) in order, to thereby form a laminated body.

First, the adhesive layer 101 that is an alloy containing Cr or Ni, the control layer 102 that is an alloy containing Cr and the like, the hard magnetic material layer 103 that is a Co alloy constituting the thin film magnet 20 are continuously deposited (accumulated) in order. The deposition can be performed by a sputtering method or the like. The substrate 10 is moved to face plural targets formed of respective materials in order, and thereby the adhesive layer 101, the control layer 102 and the hard magnetic material layer 103 are laminated on the substrate 10 in order. As described above, in forming the control layer 102 and the hard magnetic material layer 103, the substrate 10 may be heated to, for example, 100° C. to 600° C. for accelerating the crystal growth.

Note that, in deposition of the adhesive layer 101, the substrate 10 may be heated or may not be heated. To remove the moisture and so forth absorbed onto the surface of the substrate 10, the substrate 10 may be heated before the adhesive layer 101 is deposited.

Next, the dielectric layer 104, which is oxide, such as $SiO_2$, $Al_2O_3$, or $TiO_2$, or nitride, such as $Si_3N_4$ or MN is deposited (accumulated). Deposition of the dielectric layer 104 can be performed by a plasma CVD method, a reactive sputtering method or the like.

Then, a pattern by photoresist (a resist pattern), which has an opening serving as a portion where the sensitive element 31 of the sensitive part 30 is formed by a publicly known photolithography technique.

Subsequently, for the sensitive element 31, the Co alloy constituting the soft magnetic material layer 105 and the non-magnetic material constituting the non-magnetic material layer 106 are alternately deposited (accumulated). For example, the soft magnetic material layer 105*a*, the non-magnetic material layer 106*a*, the soft magnetic material layer 105*b*, the non-magnetic material layer 106*b*, the soft magnetic material layer 105*c*, the non-magnetic material layer 106*c*, and the soft magnetic material layer 105*d* are deposited in order. The deposition of the soft magnetic material layers 105 and the non-magnetic material layers 106 can be performed by using, for example, the sputtering method.

Thereafter, the resist pattern is removed, and the soft magnetic material layers 105 and the non-magnetic material layers 106 on the resist pattern are also removed (lifted-off). Consequently, the sensitive element 31 made of the soft magnetic material layers 105 and the non-magnetic material layers 106 is formed.

Next, the resist pattern by photoresist, which has openings serving a portions where the yokes 40 are formed is formed by a publicly known photolithography technique.

Then, the Co alloy constituting the soft magnetic material layer 105 is deposited (accumulated).

Thereafter, the resist pattern is removed, and the soft magnetic material layer 105 on the resist pattern is also removed (lifted-off). Consequently, the yokes 40 configured with the soft magnetic material layer 105 are formed.

Next, the connection parts 32 and the terminal parts 33 of the sensitive part 30 are formed. The connection parts 32 and the terminal parts 33 are formed by, for example, depositing the conductor layer 107 by the sputtering method or the vacuum deposition method by use of a metal mask.

Thereafter, in the soft magnetic material layer 105 constituting the sensitive element 31, the uniaxial magnetic anisotropy is imparted in the width direction (the short direction) of the sensitive element 31 in the sensitive part 30 (refer to FIG. 1A). The impartation of the uniaxial magnetic anisotropy to the soft magnetic material layer 105 can be performed by heat treatment at 400° C. in a rotating magnetic field of, for example, 3 kG (0.3 T) (heat treatment in the rotating magnetic field) and by heat treatment at 400° C. in a static magnetic field of 3 kG (0.3 T) (heat treatment in the static magnetic field) subsequent thereto. At this time, the soft magnetic material layer 105 constituting the yokes 40 is provided with the similar uniaxial magnetic anisotropy. However, the yokes 40 just have to play a role of a magnetic circuit, and may not be provided with the uniaxial magnetic anisotropy.

Next, the hard magnetic material layer 103 constituting the thin film magnet 20 is magnetized. Magnetizing of the hard magnetic material layer 103 can be performed by, in the static magnetic field or in a pulsed magnetic field, continuously applying a magnetic field larger than a coercive force of the hard magnetic material layer 103 until magnetization of the hard magnetic material layer 103 becomes saturated.

Thereafter, the plural magnetic sensors 1 formed on the substrate 10 are divided (cut) into the individual magnetic sensors 1. In other words, the substrate 10, the adhesive layer 101, the control layer 102, the hard magnetic material layer 103, the dielectric layer 104 and the soft magnetic material layer 105 are cut to have a quadrangular planar shape. Then, on the side surfaces of the hard magnetic material layer 103 that has been divided (cut), magnetic poles (the north pole and the south pole) of the thin film magnet 20 are exposed. Thus, the magnetized hard magnetic material layer 103 serves as the thin film magnet 20. The division (cutting) can be performed by a dicing method, a laser cutting method or the like.

Note that, before the process of dividing the plural magnetic sensors 1 into the individual magnetic sensors 1, the adhesive layer 101, the control layer 102, the hard magnetic material layer 103, the dielectric layer 104, and the soft magnetic material layer 105 between the adjacent magnetic sensors 1 on the substrate 10 may be removed by etching so that the planar shape of the magnetic sensor 1 is quadrangular (the planar shape of the magnetic sensor 1 shown in FIG. 1A). Then, the exposed substrate 10 may be divided (cut).

Moreover, after the process of forming the laminated body, the adhesive layer 101, the control layer 102, the hard magnetic material layer 103 and the dielectric layer 104 may be processed so that the planar shape of the magnetic sensor 1 is quadrangular (the planar shape of the magnetic sensor 1 shown in FIG. 1A).

Note that the processes in the manufacturing method described here are simplified as compared to these manufacturing methods.

In this manner, the magnetic sensor 1 is manufactured. Note that impartation of the uniaxial magnetic anisotropy to the soft magnetic material layer 105 and/or magnetization of the thin film magnet 20 may be performed on the magnetic sensor 1 or plural magnetic sensors 1 after the process of dividing the magnetic sensor 1 into the individual magnetic sensors 1.

Note that, in the case where the control layer 102 is not provided, it becomes necessary to impart the magnetic anisotropy in a plane by causing the crystal growth by heating the hard magnetic material layer 103 to not less than 800° C. after the hard magnetic material layer 103 was deposited. However, in the case where the control layer 102 is provided as in the magnetic sensor 1 to which the first exemplary embodiment is applied, since the crystal growth is accelerated by the control layer 102, the crystal growth caused by high temperature, such as not less than 800° C., is not required.

In addition, impartation of the uniaxial magnetic anisotropy to the sensitive element 31 may be performed, in depositing the soft magnetic material layer 105, by a magnetron sputtering method, instead of being performed in the above-described heat treatment in the rotating magnetic field and heat treatment in the static magnetic field. In the magnetron sputtering method, a magnetic field is formed by using magnets and electrons generated by discharge are enclosed on a surface of a target. This increases collision probability of electrons and gases to accelerate ionization of gases, to thereby improve deposition rate of a film. By the magnetic field formed by the magnets used in the magnetron sputtering method, the soft magnetic material layer 105 is deposited, and at the same time, the uniaxial magnetic anisotropy is imparted to the soft magnetic material layer 105. By doing so, it is possible to omit the process of imparting the uniaxial magnetic anisotropy in the heat treatment in the rotating magnetic field and the heat treatment in the static magnetic field.

So far, the exemplary embodiment according to the present invention has been described, but the present invention is not limited to the exemplary embodiment. Unless contrary to the gist of the present invention, various modifications and combinations may be performed.

REFERENCE SIGNS LIST

1 Magnetic sensor
10 Substrate
20 Thin film magnet
30 Sensitive part
31 Sensitive element
32 Connection part
33 Terminal part
40, 40a, 40b Yoke
101 Adhesive layer
102 Control layer
103 Hard magnetic material layer
104 Dielectric layer
105 Soft magnetic material layer
106 Non-magnetic material layer
107 Conductor layer

The invention claimed is:

1. A magnetic sensor comprising:
a non-magnetic substrate; and
a sensitive element having a longitudinal direction and a short direction, provided with uniaxial magnetic anisotropy in a direction crossing the longitudinal direction, and sensing a magnetic field by a magnetic impedance effect, wherein
the sensitive element includes a plurality of soft magnetic material layers and a plurality of non-magnetic material layers configured with a non-magnetic material and laminated between the plural soft magnetic material layers, the plurality of soft magnetic material layers and the plurality of non-magnetic material layers are alternately laminated in a thickness direction of the plurality of soft magnetic material layers and the plurality of non-magnetic material layers, and the soft magnetic material layers facing each other with each of the non-magnetic material layers interposed therebetween are antiferromagnetically coupled, and
an impedance is measured by passing a current in a surface direction of the soft magnetic material layers.

2. The magnetic sensor according to claim 1, wherein each of the non-magnetic material layers is composed of Ru or an Ru alloy.

3. The magnetic sensor according to claim 2, wherein each of the non-magnetic material layers has a thickness within a range of 0.6 nm or more and 1.4 nm or less.

4. The magnetic sensor according to claim 1, wherein, when the soft magnetic material layer is viewed from a lamination direction of the soft magnetic material layer, no closure magnetic domain is formed in the sensitive element.

5. The magnetic sensor according to claim 2, wherein, when the soft magnetic material layer is viewed from a lamination direction of the soft magnetic material layer, no closure magnetic domain is formed in the sensitive element.

6. The magnetic sensor according to claim 3, wherein, when the soft magnetic material layer is viewed from a lamination direction of the soft magnetic material layer, no closure magnetic domain is formed in the sensitive element.

* * * * *